United States Patent [19]

Kōnig

[11] Patent Number: 5,869,147

[45] Date of Patent: *Feb. 9, 1999

[54] METHOD OF MAKING A MULTILAYER TOOL SURFACE WITH PCNA INTERRUPTION OF CVD, AND TOOL MADE BY THE PROCESS

[75] Inventor: Udo Kōnig, Essen, Germany

[73] Assignee: Widia GmbH, Essen, Germany

[*] Notice: This patent issued on a continued prosecution application filed under 37 CFR 1.53(d), and is subject to the twenty year patent term provisions of 35 U.S.C. 154(a)(2).

[21] Appl. No.: 732,238

[22] PCT Filed: Apr. 1, 1995

[86] PCT No.: PCT/DE95/00449

§ 371 Date: Sep. 27, 1996

§ 102(e) Date: Sep. 27, 1996

[87] PCT Pub. No.: WO95/32317

PCT Pub. Date: Nov. 30, 1995

[30] Foreign Application Priority Data

May 20, 1994 [DE] Germany .......................... 44 17 729.1

[51] Int. Cl.$^6$ ............................. H05H 1/24; C23C 16/30; B26D 1/00

[52] U.S. Cl. ...................... 427/537; 427/249; 427/255.1; 427/255.7; 83/663; 83/679; 409/65

[58] Field of Search ...................... 427/535, 537, 427/249, 255.1, 255.7; 118/723 R, 723 MW; 428/698, 699; 83/663, 679; 409/65

[56] References Cited

U.S. PATENT DOCUMENTS

| | | | |
|---|---|---|---|
| 4,910,041 | 3/1990 | Yanagihara et al. | 427/575 |
| 5,079,031 | 1/1992 | Yamazaki et al. | 427/570 |
| 5,271,963 | 12/1993 | Eichman et al. | 427/248.1 |
| 5,300,951 | 4/1994 | Yamazaki | 427/249 |
| 5,346,600 | 9/1994 | Nieh et al. | 427/530 |
| 5,503,913 | 4/1996 | Konig et al. | 427/255.3 |
| 5,516,588 | 5/1996 | Van Den Berg et al. | 427/576 |
| 5,576,071 | 11/1996 | Sandhu | 427/534 |

FOREIGN PATENT DOCUMENTS

| | | |
|---|---|---|
| 30 27 688 B1 | 4/1981 | Germany . |
| 57-137460 | 8/1982 | Japan . |
| 5-25970 (A) | 2/1984 | Japan . |
| 5009742 | 1/1993 | Japan . |
| WO 92/17623 | 10/1992 | WIPO . |

OTHER PUBLICATIONS

"Characterization of $\alpha$–$Al_2$–$O_3$, $\kappa$–$Al_2O_3$, and $\alpha$–$\kappa$ multi-oxide coatings on cemented carbides" by S. Vuorinen, published in Thin Solid Films,/93/94(1990)536–546.

Primary Examiner—Shrive Beck
Assistant Examiner—Bret Chen
Attorney, Agent, or Firm—Herbert Dubno

[57] ABSTRACT

A tool is made in a coating vessel, depositing upon the base tool body of a hard metal or cermet, a coating by chemical vapor deposition by admitting to the vessel a reactive gas mixture capable of forming a composition selected from the group which consists of aluminum oxide and of titanium and zirconium carbide, nitride and carbonitride, and of mixtures thereof at a chemical vapor deposition pressure and temperature; and interrupting the chemical vapor deposition by a multiplicity of times by replacing the reactive gas mixture with a nonreactive gas mixture containing components selected from the group which consists of argon, hydrogen, nitrogen and mixtures thereof, lowering a pressure in the vessel to a plasma chemical vapor deposition pressure of 10 to 1000 Pa, effecting a glow discharge at the body with the body being cathodically connected at a negative D.C. voltage of 200 to 1000 volts for a period of 1 to 30 minutes, to effect plasma chemical vapor deposition coating between chemical vapor deposition coating with the reactive mixture.

8 Claims, No Drawings

METHOD OF MAKING A MULTILAYER TOOL SURFACE WITH PCNA INTERRUPTION OF CVD, AND TOOL MADE BY THE PROCESS

CROSS REFERENCE TO RELATED APPLICATIONS

This application is a national stage of PCT/DE95/00449 filed 1 Apr. 1995 and based, in turn, on German national application P 44 17 729.1 filed 20 May 1994 under the International Convention.

FIELD OF THE INVENTION

The invention relates to a tool of a base body of a hard metal or cermet and a multilayer surface coating applied by means of a CVD process on the base body and composed of carbides, nitrides and/or carbonitrides of titanium and/or zirconium and/or aluminum oxide according to German Patent Application P 42 39 234.9 corresponding to U.S. patent application Ser. No. 08/446,836, now U.S. Pat. No. 5,693,408 of 2 Dec. 1997.

The invention relates further to a process and to a device for producing this tool as well as to the use of the tool.

BACKGROUND OF THE INVENTION

In German Patent Application P 42 39 234.9 corresponding to U.S. patent application Ser. No. 08/446,836 filed 16 May 1995 now U.S. Pat. No. 5,693,408, a tool of the initially stated type is described in which the surface coating is comprised of a plurality of layers deposited in an alternating sequence by a thermal CVD process and by a glow discharge activated CVD process also known as plasma chemical vapor deposition (PCVD). The total thickness of the coating amounts to 2 through 40 $\mu$m whereby each individual layer is thicker than 0.2 $\mu$m.

The individual layers are applied by technically different processes. In the (thermal) CVD process one must use temperatures in excess of 900° C. and pressures above 10,000 Pa to achieve sufficiently high coating rates. Thus, in an example of the aforementioned patent application, a gas mixture of 2.5% $TiCl_4$, 35% $N_2$ and 62.5 $H_2$ is passed over the substrate to be coated at a temperature of 940° C. and a pressure of 25000 Pa. Thereafter or alternatingly thereto, individual layers are applied by the PCVD processes whereby, for example, a gas mixture of 1.5% $TiCl_4$, 11.5% $N_2$, 8% Ar and 79% $H_2$ is used at a pressure of 300 Pa and a temperature of 780° C. The multilayer coating of CVD layers and PCVD layers gives an unusually good mechanical stability to the coating which yields a high useful life for tools fabricated by the process reviewed in chip removal operations. The special advantage of the alternating coating by means of the CVD process and PCVD process is that in a single coating apparatus in a continuous process without intervening coating and removal of the object to be coated, the coatings can be applied.

OBJECTS OF THE INVENTION

It is the object of the present invention to provide a tool of the initially mentioned type whose coating is fine grained. It is a further object of the present invention to provide a process and an apparatus with which these coatings can be deposited.

SUMMARY OF THE INVENTION

This object is achieved in a tool of a base body of hard metal or cermet and a multilayer surface coating applied to the base body. The coating is comprised of carbides, nitrides and/or carbonitrides of titanium and/or zirconium and/or aluminum oxide by means of a CVD process according to German patent application P 42 39 234.9, corresponding to U.S. patent application Ser. No. 08/446,836 filed 16 May 1995, now U.S. Pat. No. 5,693,408 whereby the CVD process is interrupted a multiplicity of time by a plasma treatment at substantially the same high temperature, in a gas or gas mixture of argon, hydrogen and/or nitrogen admitted to the coating vessel at a pressure of 10 to 1000 Pa and with a glow discharge on the cathodically connected base body or partly coated base body by the application of a negative DC voltage maintained at 200 to 1000 V for 1 to 30 minutes.

With this tool, the CVD coating is interrupted a multiplicity of times by a plasma treatment while substantially maintaining the high temperature while a nonreactive gas mixture is applied during this plasma treatment of argon, hydrogen, and/or nitrogen at a low pressure of 10 to 1000 Pa so that on the last layer applied by means of CVD during the plasma treatment, no deposition is effected. Through the activation potential of 200 to 1000 V applied to the substrate, the surface of the last coating layer is eroded to produce numerous defect locations in the previously smooth crystallite surface with low growth active locations.

When one deposits for example TiC and/or TiN in accordance with the known (thermal) CVD process according to the state of the art, there usually arises a fine grained layer which, however, in the further course of the process becomes increasingly coarse grained because of the surfaces which are effective for the crystal growth in accordance with the preferred mode. Because of the increase in the mean particle size of the ground body at the last coating layer there is also a rough surface of the outermost coating layer. The rough surface, which is detrimental to the optical appearance and the wear properties, has not been avoidable heretofore, either by a temperature reduction and/or a pressure reduction during the deposition or by means of a multilayer laminate configuration with these individual layers with materials of different hardnesses. With the tool of the invention it is initially advantageous to deposit an approximately 0.2 to 0.4 $\mu$m thick layer of, for example, TiN by the conventional CVD process and which is relatively fine-grained. By interrupting the CVD process and adjusting a nonreactive gas mixture at low temperature and low gas throughput there are formed in the following plasma treatment, numerous defect locations in the previously smooth crystal surfaces with locations of low growth activity. After termination of the plasma treatment and renewed establishment of the original CVD coating parameters, upon the defect-location-rich surface numerous nuclei can be formed upon which a new fine crystalline growth can be produced. Because of the high surface activity this growth is also accelerated with respect to the expected growth without interrupting the CVD process by means of a plasma treatment. That means that the time loss of the intermediate plasma treatment is compensated by a higher deposition rate at least partly. The alternating CVD coating and plasma treatment are repeated until the desired coating thickness is achieved. Altogether the thus fabricated workpiece has a finer grain coating than has been possible with the previously customary CVD process.

Preferably the coatings are so applied that the temperature during the CVD process and during the plasma treatment differ from one another by at most 200° C. Furthermore, preferably a multilayer base layer, as previously described, and an outer cover layer fabricated by an uninterrupted CVD process are applied on a base body. The multilayer base layer can be comprised of Ti(C,N) and the outer cover layer of $Al_2O_3$.

The objects described at the outset are further achieved by a process for coating a base layer of hard metal or cermet with a plurality of layers comprised of carbides, nitrides and/or carbonitrides of titanium and/or zirconium and/or aluminum oxide by means of a deposition process from a gas phase. Here the CVD process is interrupted a multiplicity of times and with substantially uniform high temperature and during the interruption gas mixtures of argon, hydrogen and/or nitrogen are fed into the vessel at pressures of 10 to 1000 Pa and in that upon cathodically connected base body by the application of a negative DC voltage of 200 to 1000 V a glow discharge is maintained for a time period of 1 to 30 minutes (plasma treatment). Thus the CVD process is interrupted a plurality of times at substantially continuous high temperature whereby, during the interruption, gas mixtures of argon, helium and/or nitrogen are fed into the vessel at pressures of 10–1000 Pa. On the base body which is connected cathodically, a negative DC voltage of 200 V to 1000 V is maintained for a duration of 1 to 30 minutes for generation of a glow discharge.

Since the plasma treatment, differentiating from the process described in German Patent Application P 42 39 234.9 (U.S. Pat. No. 5,693,408), is carried out with a nonreactive gas mixture (one without, for example, chloride), significant simplifications are possible with respect to the apparatus technology. The vacuum during the plasma treatment phases can be applied by simple rotary disk pumps without devices upstream thereof for the neutralization of metal chlorides and hydrogen chloride. Even the device for voltage supply for generation of the glow discharge plasma can have substantially reduced requirements than is the case, for example, in carrying out the plasma CVD coating as described in DE 38 41 731. During the plasma coating process precisely defined temperatures, voltages and current densities must be maintained to produce a uniform coating; with the present process of the invention it is only necessary to maintain certain minimum voltages (200 V) and minimum current densities (5 mA/cm$^2$). Thus expensive generators for generating an exact pulsed DC voltage with controllable pulse duration and pause duration can be avoided; it suffices to use simple DC voltage generators or rectified alternating current without smoothing to generate the required voltage.

Even the system for gas distribution in the coating chamber can be simplified. While in the plasma-CVD process with its low process pressure, special gas inlet systems are required, since the gas mixture on the path through the coating chamber is rapidly impoverished in TiCl$_4$ and this can give rise to unsatisfactory distribution of layer thicknesses in the chamber, with the plasma treatment according to the invention the nonreactive gas mixture is not partially depleted as to one of its components so that the gas feed systems of conventional CVD apparatus can be utilized unchanged.

The production of the tool according to the invention or for carrying out the previously described process can utilize an the apparatus which, by contrast with a known apparatus representing the state of the art, has at least an electrically insulated stand for receiving the base body, a voltage feed through in the chamber for the base body and an external voltage supply. Optionally, automatic switchover can be provided with the aid of which switchover from the CVD coating to the plasma treatment can be carried out.

The described tools or the objects fabricated by the process of the invention are utilized according to a further feature of the invention as cutting inserts for turning, milling or boring or threading.

Below an embodiment of the invention is described in a CVD coating apparatus known as state of the art, which is arranged for CVD coating at temperatures 1050° C. and vacuum pressures up to 6000 Pa, an electrically insulated charging stand and a vacuum-type current feed through are built in. A DC current source is connected thereto for generating a glow discharge plasma. This device is provided with a short circuit rapid switch off and generates voltage peaks which are temporarily superimposed to ignite the plasma. The maximum adjustable negative voltage is –750 V at a current amplitude of 8 amperes.

The charging frame used can receive up to 700 turning cutting plates of hard metal with an edge length of 12.4 mm. The vacuum pressure of for example 30000 Pa generated for the CVD coating is effected by a liquid ring pump whose pumping medium is a weakly basic NaOH solution which serves, apart from the vacuum generation, simultaneously for neutralization of the exhaust gas of the coating process which, for example, contains unconsumed metal chloride and hydrogen chloride. The apparatus is, further, equipped with a rotary disk vacuum pump which originally was provided in a CVD apparatus only for testing the vacuum tightness of the coating chamber but which, however, can be used also for the plasma treatment.

CVD apparatus according to the state of the art also can include known systems for producing the gas mixtures necessary for the coating process from the chlorides of titanium, zirconium and/or aluminum and from hydrogen, nitrogen, methane, carbon dioxide and/or argon. With these systems the gas mixtures for the aforementioned plasma treatment can also be prepared. To produce a tool according to the invention, the charging frame is loaded with 250 turning cutting plates of CNMG120412 (as characterized according to German Industrial Standard 4987) of hard metal (comprised of 6% CO, 2% TiC, 4% TaC, balance WC). The coating chamber is evacuated and filled with hydrogen. After heating up with a furnace inverted over the chamber to a temperature of 980° C., a pressure of 30000 Pa is established. Under these conditions, a reactive gas mixture of 1.5% TiCl$_4$, 3.2% CH$_4$, 12% N$_2$ and 83.3% H$_2$ is passed for 20 minutes over the samples to deposit a Ti(C,N) layer. Thereafter, the feed of TiCl$_4$ and CH$_4$ is stopped and a new (nonreactive) gas mixture of 10% N$_2$, 10% H$_2$ and 80% Ar is passed through the reactor. At the same temperature, the pumping system is switched over and the pressure is switched over to the rotary disk vacuum pump and the pressure reduced to 200 Pa. A DC voltage of –600 V is thereafter applied to the charging frame. From the measurement of the discharge current the establishment of the glow discharge can be indirectly determined and the plasma treatment commenced. After a passage of five minutes, the voltage and rotary disk pump are cut off, the pressure raised to 30000 Pa, the main pump system is switched on and the above described reactive gas mixture is passed through the chamber anew. These two process steps are repeated for a number of times so that a total of ten CVD coating steps and nine plasma treatment steps are carried out. The cooling of the charge is effected in hydrogen and then later in nitrogen.

To compare the tools of the invention with such workpieces as are coated by conventional CVD processes, base bodies are coated with the above mentioned parameters for the CVD phase (omitting the plasma treatment). The duration of the CVD coating amounts to 150 minutes.

For those tests, after cooling down and opening of the chamber, samples are taken from the upper, lower and middle parts of the charging frame and the layers which have been produced are metallography investigated with the aid of the hemispherical grinding method. Under the microscope it can be observed that both coatings show no ablation at the transition between the substrate hard metal and the coating and a uniform lilac-brown coloration.

These samples with the intervening plasma treatment steps appear to be a trace darker which, however, can also be a difference which may be traced to the diamond grinding medium used. A structure similar to that of multilayer coating could be recognized only with difficulty for the upper samples.

The measurement of the layer thickness gave the following results.

|  | Layer Thickness in $\mu$m | |
| --- | --- | --- |
| Layer in charging Frame | Test With Plasma Treatment | Test Without Plasma Treatment |
| Upper | 15.6 | 10.6 |
| Middle | 13.9 | 9.3 |
| Lower | 10.4 | 7 |
| Coating Time | 150 min | 150 min |
| Treatment Time | 45 min | — |

It can be concluded that the layer thickness of the specimens with the plasma treatment steps are about a 30% greater layer thickness than that of the comparative tests. The results signify an increased layer growth speed each time following the practice of a treatment step.

Several test specimens were broken and the broken pieces investigated with their adherent layers with the aid of a scanning electron microscope at 6000 times enlargement. While an exact determination of the sizes of the crystallites of the layers was not possible, with the specimens according to the invention a clearly finer layer structure was detected which was uniform from the lowest part to the upper part of the overall layer. The specimens of the test comparison show, by contrast, in the outer part of the layer a clearly coarser crystallite. This was seen also with the outer layer surface with unbroken specimens. The specimens for the test comparison have a gravel-like rough outer surface with sharp pentaprisms, while thee specimens according to the invention had a smooth, slightly corrugated surface structure. Finally there was observed by x-ray diffraction tests, a line widening which is also characteristic of the significantly finer lattice structure of the specimens according to the invention.

To test the properties in use, from the charges of the two tests, plates were selected whose layer thickness lay in the range between 10 and 11 $\mu$m to exclude the influence of different layer thicknesses. These turning cutting plates were tested in an industrial finishing operation for the turning of axial pins with a maximum diameter of 246 mm and a length of 310 mm and of the material 42CrMo4V. The cutting speed varied with the reduction of the diameter from 75 m/min to 180 m/min. The cutting depth was 4 to 6 mm and the feeding amounted to 0.18 mm per rotation. With the coating according to the invention 12 to 15 workpieces per cutting corner were machined while with the turning cutting plates coated in the conventional manner in spite equivalence thickness layers only 6 to 8 workpieces were finished [per cutting corner]. Since neither with the substrate nor with the layer are there differences in the compositions of the materials, this improvement in the use characteristics must be attributable exclusively to the fine grained lattice structure resulting from the special coating method of the invention. The structure which is uniform over the entire thickness, is fine grained and is dense, as thus produced, results a smooth surface and also because of the high number of grain boundary surfaces is characterized by a good matching to the stresses in the substrate resulting from the thermal expansion. The applied layers have a lesser danger as to the formation of microcracks which can give rise to rupture.

I claim:

1. A method of making a tool, comprising the steps of:
    (a) in a coating vessel, depositing upon a base tool body of a hard metal or cermet, a base layer of coating by chemical vapor deposition by admitting to said vessel a reactive gas mixture capable of forming a composition selected from the group consisting of aluminum oxide, titanium nitride, titanium carbonitride, titanium carbide, zirconium carbide, zirconium nitride, zirconium carbonitride, and of mixtures thereof at a chemical vapor deposition pressure and temperature, thereby obtaining a crystallite surface of the base layer of coating;
    (b) interrupting the chemical vapor deposition of step (a) a multiplicity of times by:
        ($b_1$) replacing the reactive gas mixture with a nonreactive gas mixture containing components selected from the group consisting of argon, hydrogen, nitrogen and mixtures thereof,
        ($b_2$) simultaneously with step ($b_1$) lowering a pressure in said vessel to a pressure of 10 to 1000 Pa, and
        ($b_3$) simultaneously with steps ($b_1$) and ($b_2$) effecting a glow discharge at said body with said body being cathodically connected at a negative D.C. voltage of 200 to 1000 volts for a period of 1 to 30 minutes, to effect an erosion of the crystallite surface formed in step (a), thereby producing numerous defect locations in the crystallite surface; and
    (c) after each interruption of the chemical vapor deposition coating with said nonreactive mixture in step (b), restoring admission of said reactive mixture to said vessel and continuing to deposit subsequent layers of said coating therefrom at said chemical vapor deposition pressure and temperature, thereby producing a plurality of layers of said coating on said body.

2. The method defined in claim 1 wherein steps (a) through (c) are carried out at temperatures differing at most by 200° C., said step (b) being the plasma chemical vapor treatment of the base layer of coating.

3. The method defined in claim 1 wherein said body is provided with a respective body base layer of titanium carbonitride and the outer layer of coating applied by chemical vapor deposition is $Al_2O_3$.

4. The method defined in claim 1 wherein the chemical vapor deposition coating with said reactive mixture is carried out for intervals of 5 to 60 minutes.

5. The method defined in claim 1 wherein a ratio of durations of each chemical vapor deposition coating with said reactive mixture in step (a) and treatment of the base layer of coating in step (b) producing numerous defect locations is 2:1 to 10:1.

6. The method defined in claim 1 wherein said glow discharge is generated by a constant or pulsed direct voltage or a rectified alternating current with a first frequency on which an alternating voltage with a second frequency lower than said first frequency of alternating voltage is superimposed.

7. A tool comprising a base tool body or a hard metal or cermet provided with a multilayer coating produced by the steps of:
    (a) in a coating vessel, depositing upon said base tool body of a hard metal or cermet, a coating by chemical vapor deposition by admitting to said vessel a reactive gas mixture capable of forming a composition selected from the group consisting of aluminum oxide, titanium carbide, zirconium carbide, titanium nitride, titanium carbonitride, zirconium nitride, zirconium carbonitride, and of mixtures thereof at a chemical vapor deposition pressure and temperature, thereby forming a base layer of coating having a crystallite surface;

(b) interrupting the chemical vapor deposition of step (a) a multiplicity of times by:

(b$_1$) replacing the reactive gas mixture with a nonreactive gas mixture containing components selected from the group consisting of argon, hydrogen, nitrogen and mixtures thereof, (b$_2$) lowering a pressure in said vessel to a pressure of 10 to 1000 Pa, and (b$_3$) effecting a glow discharge at said body with said body being cathodically connected at a negative D.C. voltage of 200 to 1000 volts for a period of 1 to 30 minutes, to effect an erosion of a coating formed prior to the interruption to produce numerous defect locations in the crystallite surface; and (c) after each interruption of the chemical vapor deposition coating with said non-reactive mixture in step (b), restoring admission of said reactive mixture to said vessel and continuing to deposit said composition therefrom at said chemical vapor deposition pressure and temperature, thereby producing a plurality of layers of said coating on said body.

8. The tool defined in claim 7 wherein said tool is a turning, milling, boring or thread-cutting tool.

* * * * *